(12) United States Patent
Fukuda

(10) Patent No.: US 9,418,960 B2
(45) Date of Patent: Aug. 16, 2016

(54) SEMICONDUCTOR CHIP AND SEMICONDUCTOR PACKAGE

(71) Applicant: Kabushiki Kaisha Toshiba, Minato-ku, Tokyo (JP)

(72) Inventor: Shohei Fukuda, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/634,571

(22) Filed: Feb. 27, 2015

(65) Prior Publication Data
US 2015/0262964 A1    Sep. 17, 2015

(30) Foreign Application Priority Data
Mar. 12, 2014  (JP) .................. 2014-049393

(51) Int. Cl.
*H01L 29/40*    (2006.01)
*H01L 23/00*    (2006.01)
(Continued)

(52) U.S. Cl.
CPC .............. *H01L 24/49* (2013.01); *H01L 23/481* (2013.01); *H01L 23/528* (2013.01); *H01L 24/06* (2013.01); *H03K 19/17744* (2013.01); *G06F 17/5068* (2013.01); *H01L 24/05* (2013.01); *H01L 24/48* (2013.01); *H01L 2224/05554* (2013.01); *H01L 2224/06133* (2013.01); *H01L 2224/06135* (2013.01); *H01L 2224/06139* (2013.01); *H01L 2224/48011* (2013.01); *H01L 2224/48091* (2013.01); *H01L 2224/49431* (2013.01);
(Continued)

(58) Field of Classification Search
CPC .................................... H01L 23/528
USPC ........................................... 257/784
See application file for complete search history.

(56) References Cited

U.S. PATENT DOCUMENTS 5,539,223 A   7/1996  Sugoh et al.
6,242,814 B1  6/2001  Bassett
(Continued)

FOREIGN PATENT DOCUMENTS

EP    1746648 A2   1/2007
EP    1746648 A3   1/2007
(Continued)

OTHER PUBLICATIONS

Singaporean Office Action issued on Aug. 4, 2015 in corresponding Singaporean Application No. 10201501352V, along with English translation thereof.
(Continued)

*Primary Examiner* — Tuan Nguyen
(74) *Attorney, Agent, or Firm* — White & Case LLP

(57) ABSTRACT

The driver semiconductor package includes a base substrate. The semiconductor package includes a semiconductor chip mounted on the base substrate. The semiconductor chip includes a core region disposed in a center part of the semiconductor chip, an internal circuit being provided in the core region. The semiconductor chip includes a plurality of IO cell regions disposed in a line along a side of the semiconductor chip, a differential circuit being provided in each of the plurality of IO cell regions. The semiconductor chip includes a non-inverting pad electrode disposed above each of the IO cell regions and electrically connected to a non-inverting terminal of the differential circuit. The semiconductor chip includes an inverting pad electrode disposed above each of the IO cell regions and connected to an inverting terminal of the differential circuit.

14 Claims, 11 Drawing Sheets

(51) Int. Cl.
  *H01L 23/48* (2006.01)
  *H01L 23/528* (2006.01)
  *H03K 19/177* (2006.01)
  *G06F 17/50* (2006.01)
  *H03K 19/0185* (2006.01)

(52) U.S. Cl.
  CPC ............... *H01L2224/49433* (2013.01); *H01L 2924/00014* (2013.01); *H01L 2924/386* (2013.01); *H03K 19/018514* (2013.01)

(56) References Cited

U.S. PATENT DOCUMENTS

| | | | | |
|---|---|---|---|---|
| 2002/0056857 | A1* | 5/2002 | Iwasa | G06F 17/5072 257/203 |
| 2009/0146273 | A1* | 6/2009 | Yamada | H01L 23/50 257/666 |
| 2013/0134579 | A1 | 5/2013 | Howard et al. | |
| 2013/0256906 | A1 | 10/2013 | Mori et al. | |

FOREIGN PATENT DOCUMENTS

| | | | |
|---|---|---|---|
| JP | 2005-198024 A | 7/2005 | |
| JP | 2007-035707 A | 2/2007 | |
| JP | 2007-294768 A | 11/2007 | |
| JP | 2007294768 | * 11/2007 | ............ H01L 21/60 |
| JP | 4370913 B2 | 11/2009 | |
| JP | 2010-135454 A | 6/2010 | |
| JP | 2010-251468 A | 11/2010 | |
| JP | 4879899 B2 | 2/2012 | |
| JP | 2013-131619 A | 7/2013 | |
| KR | 10-0127492 B1 | 12/1997 | |
| WO | 2007/015435 A1 | 2/2007 | |

OTHER PUBLICATIONS

Taiwanese Office Action issued on Dec. 25, 2015 in corresponding Taiwanese Application No. 104105669, along with English translation thereof.

European Extended Search Report dated Dec. 9, 2015 in corresponding European Application No. 15156566.0.

Singaporean Office Action issued on Mar. 8, 2016 in corresponding Singaporean Application No. 10201501352V.

Korean Office Action issued on Mar. 4, 2016 in corresponding Korean Application No. 10-2015-0027373, along with English translation thereof.

* cited by examiner

SEMICONDUCTOR CHIP AND SEMICONDUCTOR PACKAGE

CROSS-REFERENCE TO RELATED APPLICATION

This application is based upon and claims the benefit of priority from the prior Japanese Patent Application No. 2014-049393, filed on Mar. 12, 2014, the entire contents of which are incorporated herein by reference.

BACKGROUND

1. Field

Embodiments described herein relate generally to a semiconductor chip and a semiconductor package.

2. Background Art

To input differential signals to pad electrodes disposed in an IO cell region of a semiconductor chip in a semiconductor package or output differential signals from the pad electrodes disposed in the IO cell region of the semiconductor chip in the semiconductor package, for example, an inverted signal and a non-inverted signal need to be input to or output from different pad electrodes in the IO cell region.

If pad electrodes on a semiconductor chip for a pair of differential signals are connected to a semiconductor package substrate by bonding wires, lengths of wires for the inverted signal and the non-inverted signal from the pad electrodes on the semiconductor chip to package balls are differ from each other, and characteristics of the differential signals can deteriorate.

DETAILED DESCRIPTION

A semiconductor package according to an embodiment includes a base substrate. The semiconductor package includes a semiconductor chip mounted on the base substrate. The semiconductor chip includes a core region disposed in a center part of the semiconductor chip, an internal circuit being provided in the core region. The semiconductor chip includes a plurality of IO cell regions disposed in a line along a side of the semiconductor chip, a differential circuit being provided in each of the plurality of IO cell regions. The semiconductor chip includes a non-inverting pad electrode disposed above each of the IO cell regions and electrically connected to a non-inverting terminal of the differential circuit. The semiconductor chip includes an inverting pad electrode disposed above each of the IO cell regions and connected to an inverting terminal of the differential circuit. A first set of the non-inverting pad electrode and the inverting pad electrode is disposed above a first IO cell region of the plurality of IO cell regions, and the first set is disposed in a first line along the side of the semiconductor chip. A second set of the non-inverting pad electrode and the inverting pad electrode is disposed above a second IO cell region of the plurality of IO cell regions, and the second set is disposed in a second line along the side of the semiconductor chip.

A first set of a first non-inverting pad electrode and a first inverting pad electrode is disposed above a first IO cell region of the plurality of IO cell regions, and the first set is disposed so that the first non-inverting pad electrode and the first inverting pad electrode are disposed along a first line along the side of the semiconductor chip.

A second set of a second non-inverting pad electrode and a second inverting pad electrode is disposed above a second IO cell region of the plurality of IO cell regions, and the second set is disposed so that the second non-inverting pad electrode and the second inverting pad electrode are disposed along a second line along the side of the semiconductor chip.

In the following, embodiments will be described with reference to the drawings.

(First Embodiment)

Figure 1:
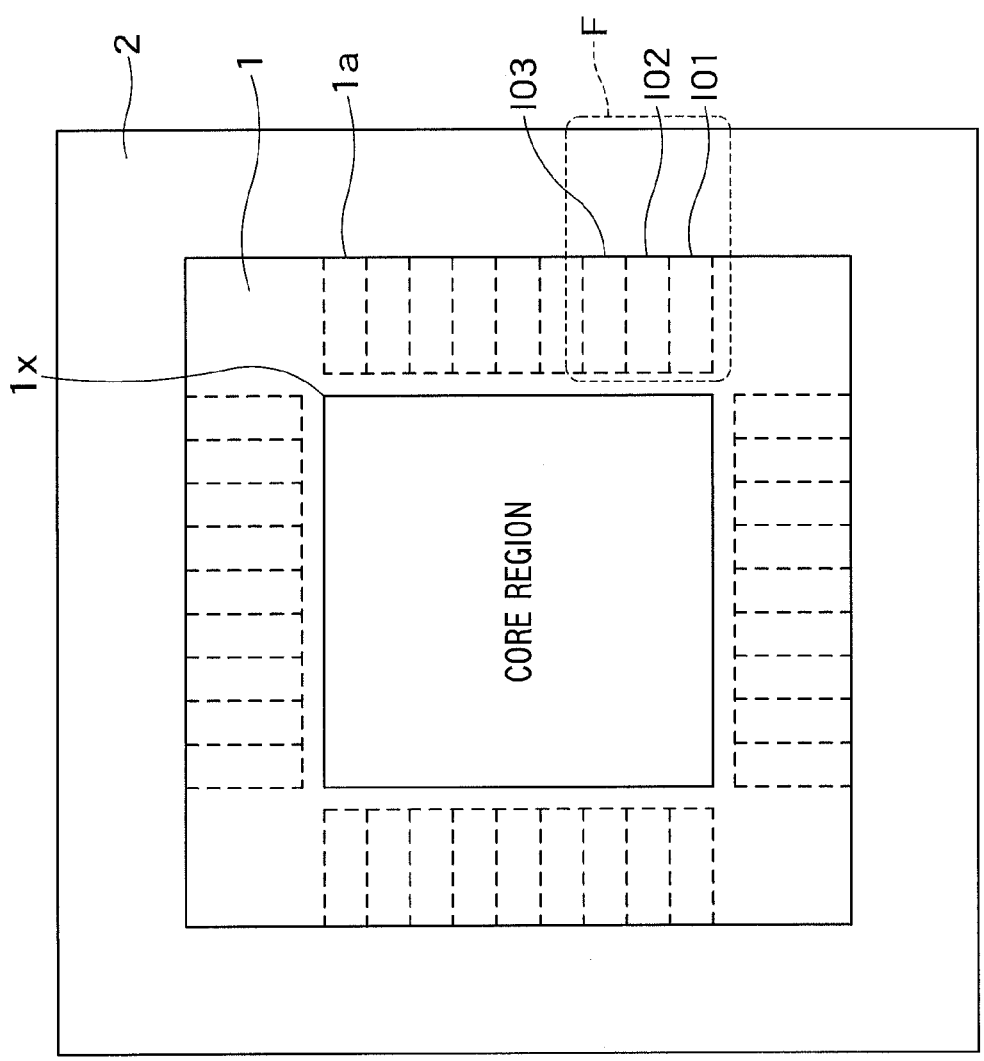
FIG. 1 is a top view showing an example of a configuration of a semiconductor package 100 according to a first embodiment.
Figure 2:
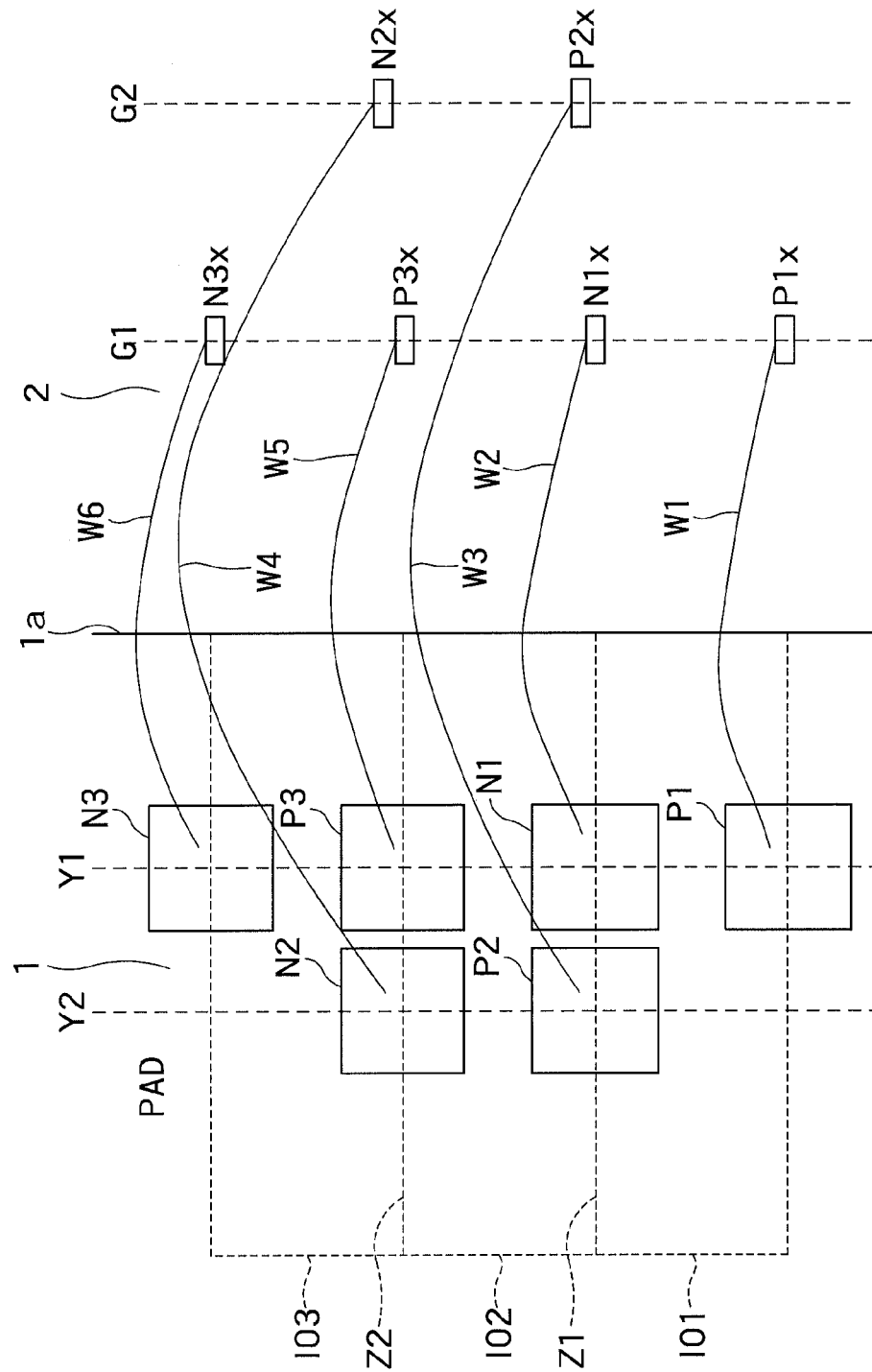
FIG. 2 is a top view showing an example of a configuration of a region "F" of the semiconductor package 100 shown in FIG. 1.
Figure 3:
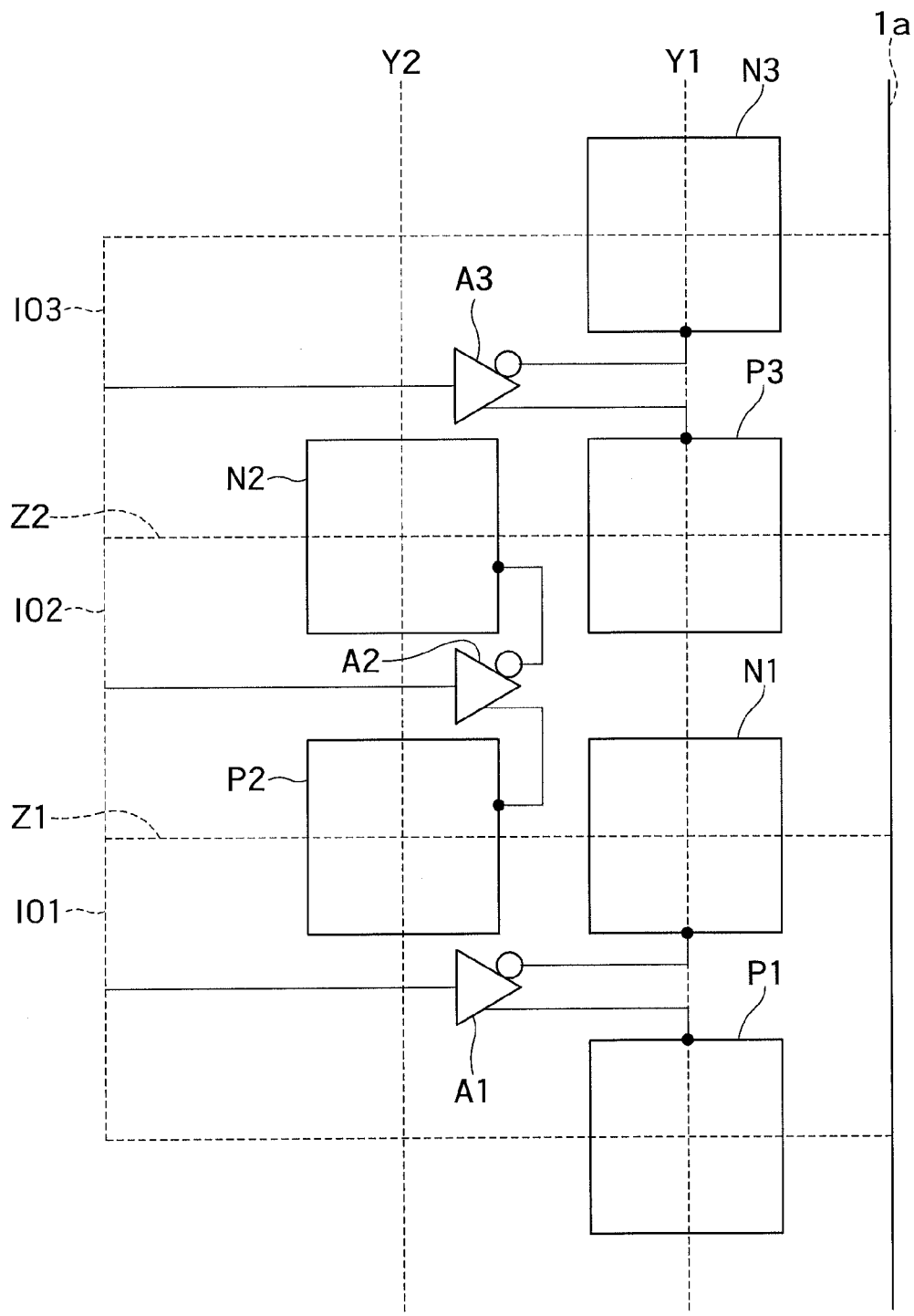
FIG. 3 is a top view showing an example of connections between a differential amplifying circuit and pad electrodes in each IO cell region shown in FIG. 2.

FIG. 1 is a top view showing an example of a configuration of a semiconductor package 100 according to a first embodiment. FIG. 2 is a top view showing an example of a configuration of a region "F" of the semiconductor package 100 shown in FIG. 1. FIG. 3 is a top view showing an example of connections between a differential amplifying circuit and pad electrodes in each IO cell region shown in FIG. 2.

In FIG. 1, illustration of a sealing resin, pad electrodes, bonding wires and bonding fingers is omitted.

As shown in FIG. 1, the semiconductor package 100 includes a semiconductor chip 1 and a base substrate 2.

The base substrate 2 is made of an insulating material and is configured so that the semiconductor chip 1 can be mounted on an upper surface of the base substrate 2. On the base substrate 2, the semiconductor chip 1 is sealed with a sealing resin (not shown). A solder ball (not shown) that serves as an external terminal of the semiconductor package 100 is disposed on a lower surface of the base substrate 2.

The solder ball is electrically connected to a bonding finger described later (not shown) by internal wiring provided in the base substrate 2 and substrate wiring provided on a surface of the base substrate 2, for example.

The semiconductor chip 1 is mounted on a center part of the base substrate 2. The semiconductor chip 1 is bonded to the base substrate 2 by a resin or the like.

As shown in FIGS. 1 and 2, the semiconductor chip 1 includes a core region "1x", a plurality of IO cell regions (a first IO cell region "IO1", a second IO cell region "IO2" and a third IO cell region "IO3"), non-inverting pad electrodes (a first non-inverting pad electrode "P1", a second non-inverting pad electrode "P2" and a third non-inverting pad electrode "P3"), and inverting pad electrodes (a first inverting pad electrode "N1", a second inverting pad electrode "N2" and a third inverting pad electrode "N3"), for example. The core region "1x" is arranged in a center part of the semiconductor chip 1, and an internal circuit is provided in the core region "1x" (FIG. 1).

The plurality of IO cell regions (the first IO cell region "IO1", the second IO cell region "IO2" and the third IO cell region "IO3") are arranged in a periphery of the core region "1x" in a line along a side "1a" of the semiconductor chip 1 (FIGS. 1 and 2).

For example, the second IO cell region "IO2" is adjacent to the first IO cell region "IO1" and separated from the first IO cell region "IO1" by a boundary "Z1", as shown in FIG. 2.

The third IO cell region "IO3" is adjacent to the second IO cell region "IO2" and separated from the second IO cell region "IO2" by a boundary "Z2".

As described later, the plurality of IO cell regions "IO1", "IO2" and "IO3" are each provided with a differential amplifying circuit (differential circuit) (FIG. 3). The plurality of IO cell regions "IO1", "IO2" and "IO3" have a similar circuit configuration including the differential amplifying circuit. The term "similar" used herein means that the IO cell regions have the same circuit configuration except for the configuration of the wiring layer.

As shown in FIG. 2, a plurality of bonding fingers (a first finger "P1x", a second finger "N1x", a third finger "P2x", a fourth finger "N2x", a fifth finger "P3x" and a sixth finger "N3x") are provided on the base substrate 2. The plurality of bonding fingers are electrodes made of a metal. The plurality of bonding fingers are arranged on the base substrate 2 to surround the region in which the semiconductor chip 1 is mounted.

In particular, the first finger "Pix", the second finger "N1x", the fifth finger "P3x" and the sixth finger "N3x" are arranged on the base substrate 2 in a line (on a line "G1") along the side "1a" of the semiconductor chip 1.

The third finger "P2x" and the fourth finger "N2x" are arranged on the base substrate 2 in a line (on a line "G2", which is different from the line "G1") along the side "1a" of the semiconductor chip 1.

As shown in FIG. 2, the line "G1" is closer to the side "1a" of the semiconductor chip 1 than the line "G2".

As shown in FIG. 2, sets of a non-inverting pad electrode and an inverting pad electrode (a first set of the first non-inverting pad electrode "P1" and the first inverting pad electrode "N1", a second set of the second non-inverting pad electrode "P2" and the second inverting pad electrode "N2", a third set of the third non-inverting pad electrode "P3" and the third inverting pad electrode "N3") are arranged in two lines ("Y1" and "Y2") along the side "1a" of the semiconductor chip 1.

In particular, the first set of the first non-inverting pad electrode "P1" and the first inverting pad electrode "N1" is disposed on the first line "Y1" of the two lines, which is closer to the outer periphery of the semiconductor chip 1. The second set of the second non-inverting pad electrode "P2" and the second inverting pad electrode "N2" is disposed on the second line "Y2" of the two lines, which is closer to the center of the semiconductor chip 1. The third set of the third non-inverting pad electrode "P3" and the third inverting pad electrode "N3" is disposed on the first line "Y1" of the two lines, which is closer to the outer periphery of the semiconductor chip 1.

The first inverting pad electrode "N1" and the second non-inverting pad electrode "P2" are arranged side by side in a direction perpendicular to the side "1a" of the semiconductor chip 1. More specifically, the first inverting pad electrode "N1" and the second non-inverting pad electrode "P2" are arranged on the boundary "Z1" between the first IO cell region "IO1" and the second IO cell region "IO2".

The second inverting pad electrode "N2" and the third non-inverting pad electrode "P3" are arranged side by side in the direction perpendicular to the side "1a" of the semiconductor chip 1. More specifically, the second inverting pad electrode "N2" and the third non-inverting pad electrode "P3" are arranged on the boundary "Z2" between the second IO cell region "IO2" and the third IO cell region "IO3".

As shown in FIG. 2, the semiconductor package 100 includes a plurality of bonding wires (a first wire "W1", a second wire "W2", a third wire "W3", a fourth wire "W4", a fifth wire "W5" and a sixth wire "W6").

The first wire "W1" electrically connects the first non-inverting pad electrode "P1" of the first set and the first finger "P1x" provided on the base substrate 2 to each other.

The second wire "W2" electrically connects the first inverting pad electrode "N1" of the first set and the second finger "N1x" provided on the base substrate 2 to each other. The length of the first wire "W1" is equal to the length of the second wire "W2". In other words, the wiring length between the first non-inverting pad electrode "P1" and the first finger "P1x" is equal to the wiring length between the first inverting pad electrode "N1" and the second finger "N1x". The third wire "W3" electrically connects the second non-inverting pad electrode "P2" of the second set and the third finger "P2x" provided on the base substrate 2 to each other.

The fourth wire "W4" electrically connects the second inverting pad electrode "N2" of the second set and the fourth finger "N2x" provided on the base substrate 2 to each other.

The length of the third wire "W3" is equal to the length of the fourth wire "W4". In other words, the wiring length between the second non-inverting pad electrode "P2" and the third finger "P2x" is equal to the wiring length between the second inverting pad electrode "N2" and the fourth finger "N2x".

The fifth wire "W5" electrically connects the third non-inverting pad electrode "P3" of the third set and the fifth finger "P3x" provided on the base substrate 2 to each other.

The sixth wire "W6" electrically connects the third inverting pad electrode "N3" of the third set and the sixth finger "N3x" provided on the base substrate 2 to each other.

The length of the fifth wire "W5" is equal to the length of the sixth wire "W6". In other words, the wiring length between the third non-inverting pad electrode "P3" and the fifth finger "P3x" is equal to the wiring length between the third inverting pad electrode "N3" and the sixth finger "N3x".

As described above, the lengths of the wires from the non-inverting pad electrode and inverting pad electrode connected to one differential amplifying circuit of the semiconductor chip 1 to the bonding fingers are equal.

As shown in FIG. 3, a first differential amplifying circuit "A1" is provided in the first IO cell region "IO1". A second differential amplifying circuit "A2" is provided in the second IO cell region "IO2", which is adjacent to the first IO cell region "IO1". A third differential amplifying circuit "A3" is provided in the third IO cell region "IO3", which is adjacent to the second IO cell region "IO2".

The first inverting pad electrode "N1" is electrically connected to an inverting output terminal (inverting terminal) of the first differential amplifying circuit "A1" provided in the first IO cell region "IO1".

The first non-inverting pad electrode "P1" is electrically connected to a non-inverting output terminal (non-inverting terminal) of the first differential amplifying circuit "A1" provided in the first IO cell region "IO1".

The second inverting pad electrode "N2" is electrically connected to an inverting output terminal (inverting terminal) of the second differential amplifying circuit "A2" provided in the second IO cell region "IO2".

The second non-inverting pad electrode "P2" is electrically connected to a non-inverting output terminal (non-inverting terminal) of the second differential amplifying circuit "A2" provided in the second IO cell region "IO2".

The third inverting pad electrode "N3" is electrically connected to an inverting output terminal (inverting terminal) of the third differential amplifying circuit "A3" provided in the third IO cell region "IO3".

The third non-inverting pad electrode "P3" is electrically connected to a non-inverting output terminal (non-inverting terminal) of the third differential amplifying circuit "A3" provided in the third IO cell region "IO3".

As described above, differential signals output from the differential amplifying circuits are supplied to the inverting pad electrodes and the non-inverting pad electrodes. And, as described above, the lengths of the wires from the non-inverting pad electrode and inverting pad electrode connected to one differential amplifying circuit of the semiconductor chip 1 to the bonding fingers are equal.

Therefore, characteristics of the differential signals of the differential amplifying circuits can be improved.

The example shown in FIG. 3 described above concerns a circuit configuration in which the differential amplifying circuits provide differential outputs. However, a circuit configuration in which the differential amplifying circuits receive differential inputs is also possible. In that case, the inverting input terminals (inverting terminals) of the differential amplifying circuits are connected to the inverting pad electrodes, and the non-inverting input terminals (non-inverting terminals) of the differential amplifying circuits are connected to the non-inverting pad electrodes.

Figure 4:
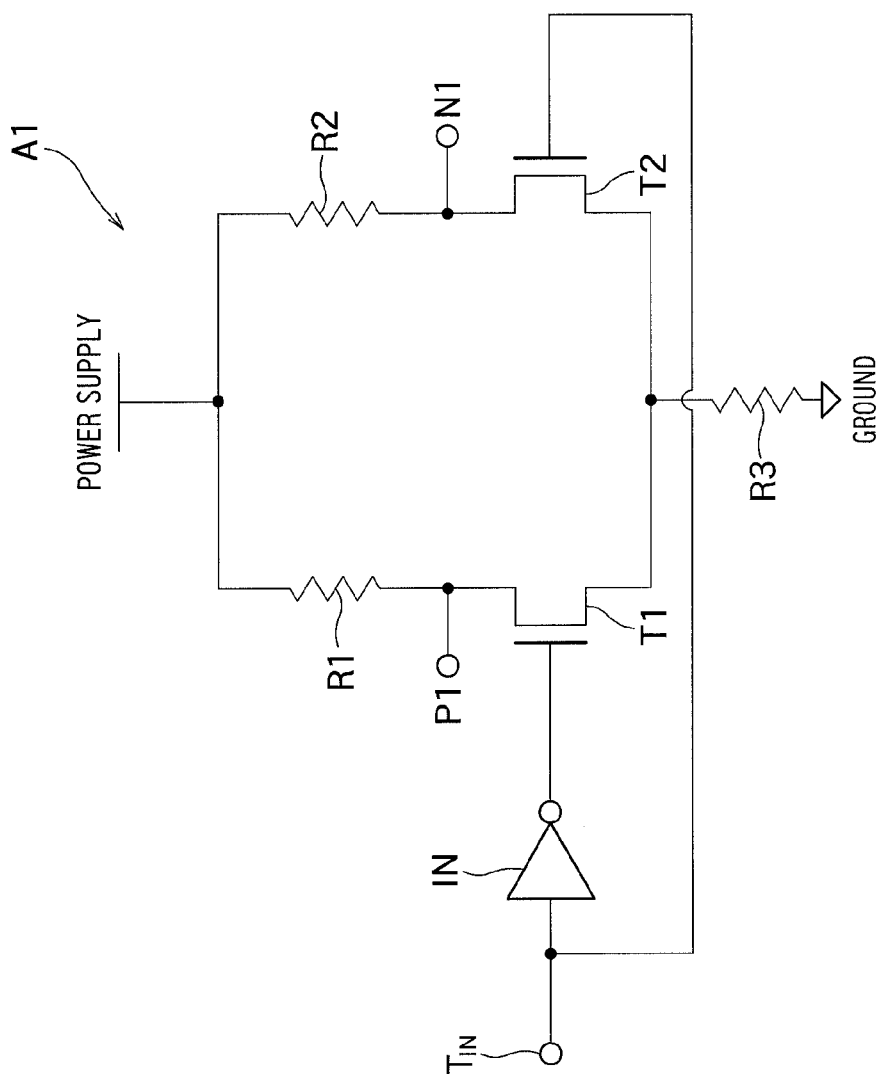
FIG. 4 is a circuit diagram showing an example of a circuit configuration of the first differential amplifying circuit "A1" shown in FIG. 3.

FIG. 4 is a circuit diagram showing an example of a circuit configuration of the first differential amplifying circuit "A1" shown in FIG. 3.

As shown in FIG. 4, the first differential amplifying circuit "A1" includes a first resistor "R1", a second resistor "R2", a third resistor "R3", a first nMOS transistor "T1", a second nMOS transistor "T2" and an inverter "IN", for example.

The first resistor "R1" is connected to a power supply at one end thereof and to the first non-inverting pad electrode "P1" at another end thereof.

The first nMOS transistor "T1" is connected to the first non-inverting pad electrode "P1" at a drain thereof.

The inverter "IN" is connected to an input terminal "TIN" at an input thereof and to a gate of the first nMOS transistor "T1" at an output thereof. The input terminal "TIN" of the first differential amplifying circuit "A1" is electrically connected to an output of a logic circuit of the core region "1x".

The second resistor "R2" is connected to the power supply at one end thereof and to the first inverting pad electrode "N1" at another end thereof.

The second nMOS transistor "T2" is connected to the first inverting pad electrode "N1" at a drain thereof.

The third resistor "R3" is connected to sources of the first nMOS transistor "T1" and the second nMOS transistor "T2" at one end thereof and to a ground at another end thereof.

Although FIG. 4 shows an example of the circuit configuration of the first differential amplifying circuit "A1", the differential amplifying circuits in the other IO cell regions, including the second and third differential amplifying circuits "A2" and "A3", have the same circuit configuration.

Figure 5:
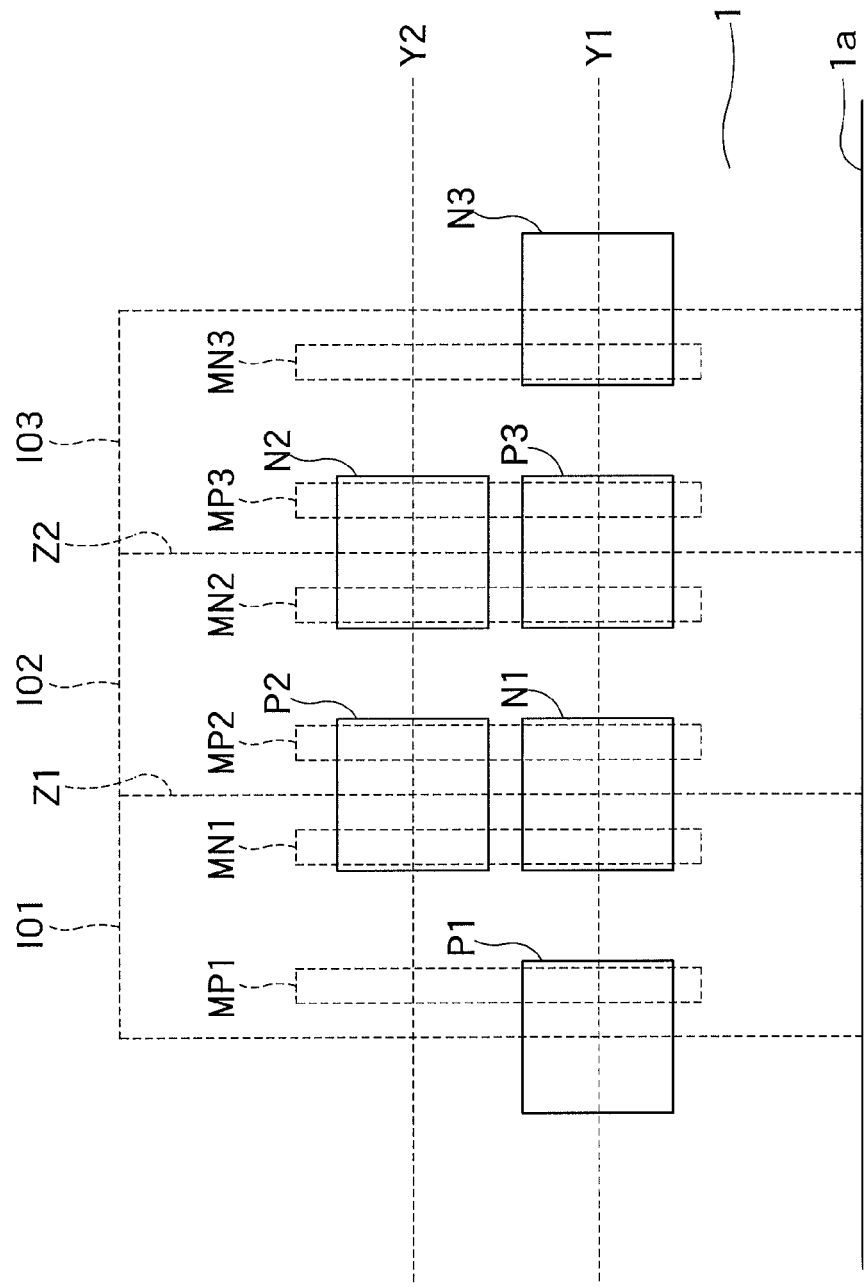
FIG. 5 is a top view showing an example of a configuration of metal layers and the pad electrodes in the IO cell regions shown in FIG. 2.
Figure 6:
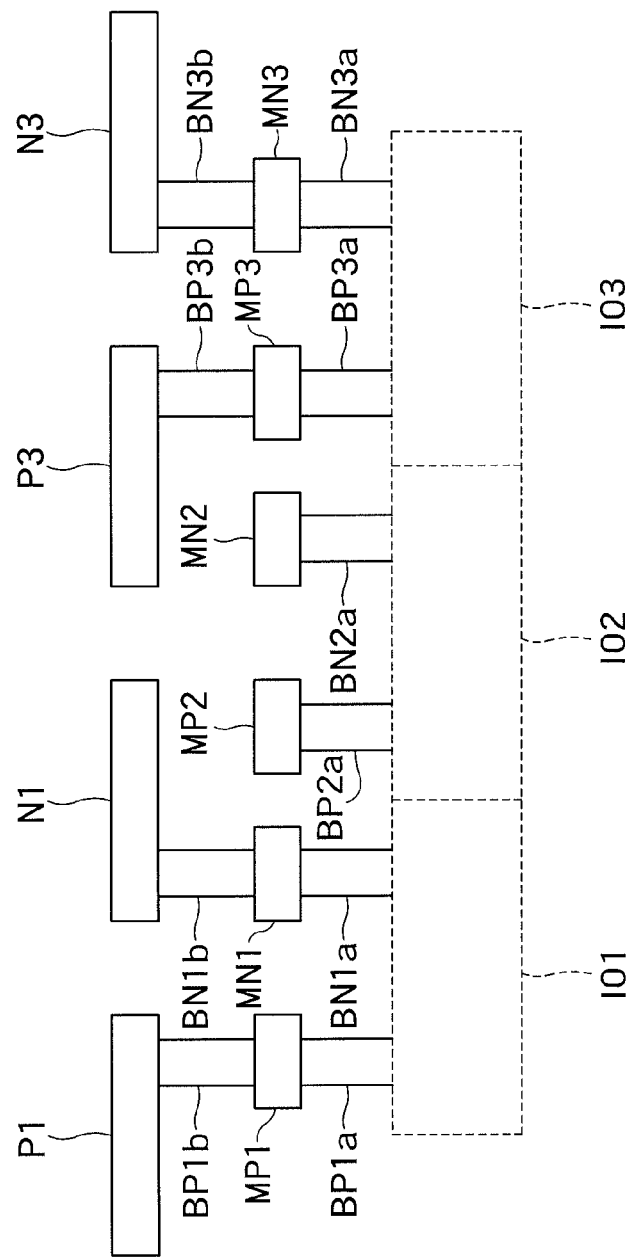
FIG. 6 is a cross-sectional view of the arrangement shown in FIG. 5 taken along the first line "Y1"
Figure 7:
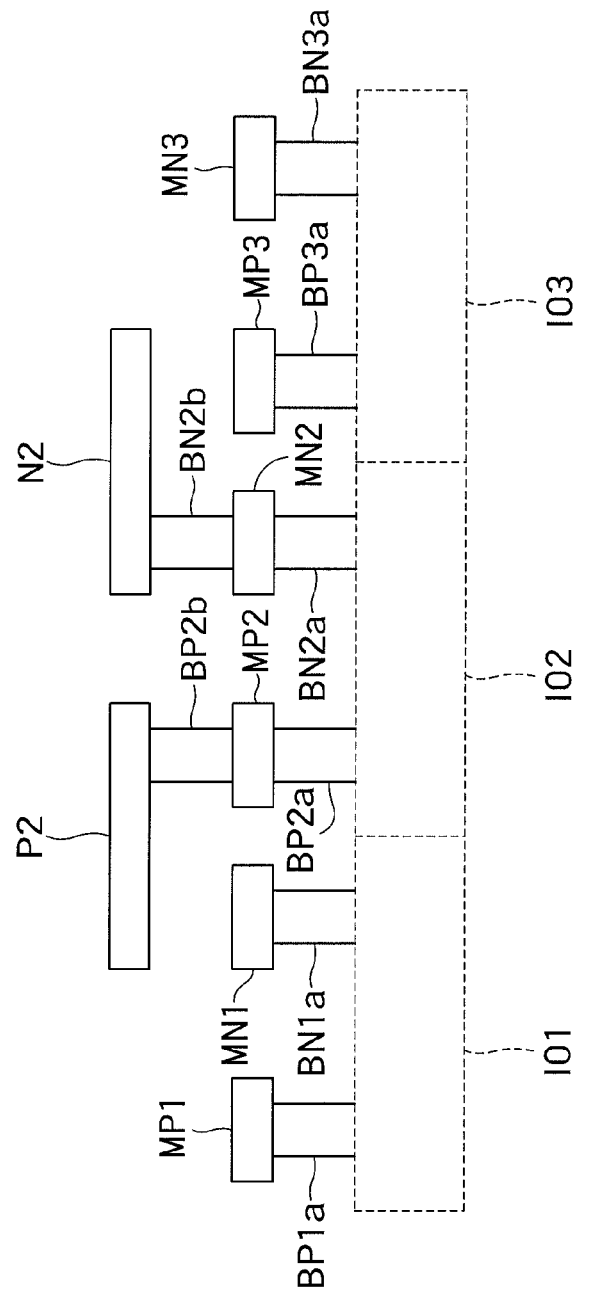
FIG. 7 is a cross-sectional view of the arrangement shown in FIG. 5 taken along the second line "Y2"

FIG. 5 is a top view showing an example of a configuration of metal layers and the pad electrodes in the IO cell regions shown in FIG. 2. FIG. 6 is a cross-sectional view of the arrangement shown in FIG. 5 taken along the first line "Y1". FIG. 7 is a cross-sectional view of the arrangement shown in FIG. 5 taken along the second line "Y2". For the sake of simplicity, FIG. 5 does not show vias shown in FIGS. 6 and 7. In FIGS. 6 and 7, illustration of an insulating layer is omitted.

As shown in FIGS. 5 to 7, the semiconductor chip 1 includes first metal layer parts "MP1", "MP2" and "MP3", second metal layer parts "MN1", "MN2" and "MN3", and vias "BP1a", "BP1b", "BP2a", "BP2b", "BP3a", "BP3b", "BN1a", "BN1b", "BN2a", "BN2b", "BN3a" and "BN3b".

As shown in FIGS. 6 and 7, the first to third non-inverting pad electrodes "P1", "P2" and "P3" are disposed above the first to third IO cell regions "IO1", "IO2" and "IO3", respectively. The first to third inverting pad electrodes "N1", "N2" and "N3" are disposed above the first to third IO cell regions "IO1", "IO2" and "IO3", respectively.

As shown in FIGS. 5 to 7, the first metal layer part "MP1" is disposed between the first IO cell region "IO1" and the first non-inverting pad electrode "P1". The first metal layer part "MP1" extends above the first IO cell region "IO1" in the direction perpendicular to the side "1a" of the semiconductor chip 1 (FIG. 5).

The first metal layer part "MP1" electrically connects the non-inverting output terminal of the first differential amplifying circuit "A1" and the first non-inverting pad electrode "P1" to each other through the vias "BP1a" and "BP1b".

The second metal layer part "MN1" is disposed between the first IO cell region "IO1" and the first inverting pad electrode "N1". The second metal layer part "MN1" extends above the first IO cell region "IO1" in the direction perpendicular to the side "1a" of the semiconductor chip 1 (FIG. 5).

The second metal layer part "MN1" electrically connects the inverting output terminal of the first differential amplifying circuit "A1" and the first inverting pad electrode "N1" to each other through the vias "BN1a" and "BN1b".

As shown in FIGS. 5 to 7, the first metal layer part "MP2" is disposed between the second IO cell region "IO2" and the second non-inverting pad electrode "P2". The first metal layer part "MP2" extends above the second IO cell region "IO2" in the direction perpendicular to the side "1a" of the semiconductor chip 1 (FIG. 5).

The first metal layer part "MP2" electrically connects the non-inverting output terminal of the second differential amplifying circuit "A2" and the second non-inverting pad electrode "P2" to each other through the vias "BP2a" and "BP2b".

The second metal layer part "MN2" is disposed between the second IO cell region "IO2" and the second inverting pad electrode "N2". The second metal layer part "MN2" extends above the second IO cell region "IO2" in the direction perpendicular to the side "1a" of the semiconductor chip 1 (FIG. 5).

The second metal layer part "MN2" electrically connects the inverting output terminal of the second differential amplifying circuit "A2" and the second inverting pad electrode "N2" to each other through the vias "BN2a" and "BN2b".

As shown in FIGS. 5 to 7, the first metal layer part "MP3" is disposed between the third IO cell region "IO3" and the third non-inverting pad electrode "P3". The first metal layer part "MP3" extends above the third IO cell region "IO3" in the direction perpendicular to the side "1a" of the semiconductor chip 1 (FIG. 5).

The first metal layer part "MP3" electrically connects the non-inverting output terminal of the third differential amplifying circuit "A3" and the third non-inverting pad electrode "P3" to each other through the vias "BP3a" and "BP3b".

The second metal layer part "MN3" is disposed between the third IO cell region "IO3" and the third inverting pad electrode "N3". The second metal layer part "MN3" extends above the third IO cell region "IO3" in the direction perpendicular to the side "1a" of the semiconductor chip 1 (FIG. 5).

The second metal layer part "MN3" electrically connects the inverting output terminal of the third differential amplifying circuit "A3" and the third inverting pad electrode "N3" to each other through the vias "BN3a" and "BN3b".

As shown in FIG. 5, the length of the first metal layer parts "MP1", "MP2" and "MP3" in the direction perpendicular to the side "1a" of the semiconductor chip 1 is equal to the length of the second metal layer parts "MN1", "MN2" and "MN3" in the direction perpendicular to the side "1a" of the semiconductor chip 1, for example.

In the arrangement of the metal layer parts shown in FIGS. 5 to 7, for example, the pad electrodes can be arranged in two lines along a side of the semiconductor chip.

As described above, since the lengths of the wires from the non-inverting pad electrode and inverting pad electrode connected to one differential amplifying circuit of the semiconductor chip 1 to the bonding fingers are equal, characteristics of the differential signals of the differential amplifying circuits can be improved.

That is, the semiconductor chip according to this embodiment can improve characteristics of the differential signals.

(Second Embodiment)

Figure 8:
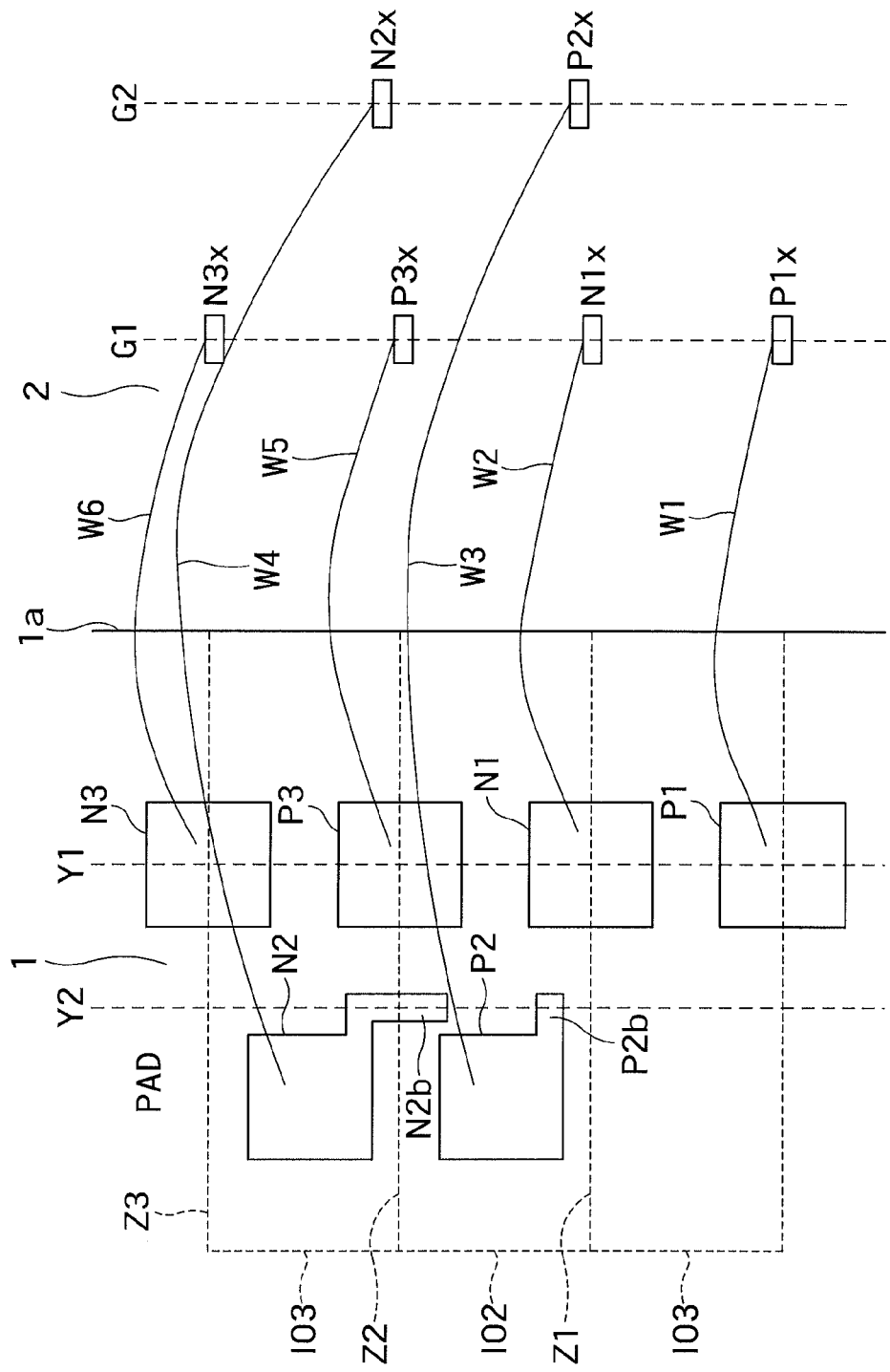
FIG. 8 is a top view showing another example of the configuration of the region "F" of the semiconductor package 100 shown in FIG. 1.
Figure 9:
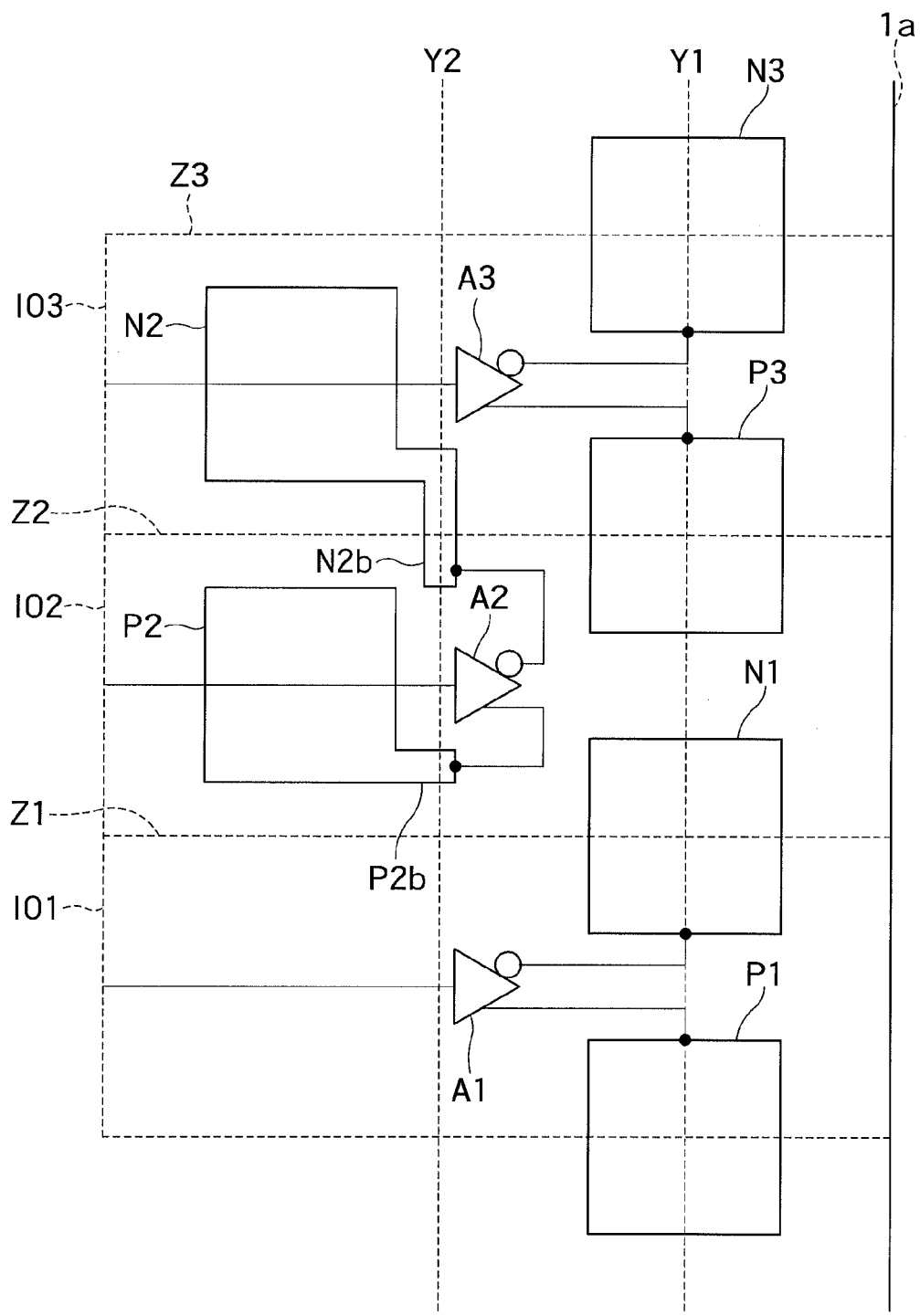
FIG. 9 is a top view showing an example of connections between a differential amplifying circuit and pad electrodes in each HD cell region shown in FIG. 8.

FIG. 8 is a top view showing another example of the configuration of the region "F" of the semiconductor package 100 shown in FIG. 1. FIG. 9 is a top view showing an example of connections between a differential amplifying circuit and pad electrodes in each IO cell region shown in FIG. 8.

As shown in FIG. 8, sets of a non-inverting pad electrode and an inverting pad electrode (the first set of the first non-inverting pad electrode "P1" and the first inverting pad electrode "N1", a second set of a second non-inverting pad electrode "P2" and a second inverting pad electrode "N2", the third set of the third non-inverting pad electrode "P3" and the third inverting pad electrode "N3") are arranged in two lines ("Y1" and "Y2") along the side "1a" of the semiconductor chip 1.

In particular, the first set of the first non-inverting pad electrode "P1" and the first inverting pad electrode "N1" is disposed on the first line "Y1" of the two lines, which is closer to the outer periphery of the semiconductor chip 1. The second set of the second non-inverting pad electrode "P2" and the second inverting pad electrode "N2" is disposed on the second line "Y2" of the two lines, which is closer to the center of the semiconductor chip 1. The third set of the third non-inverting pad electrode "P3" and the third inverting pad electrode "N3" is disposed on the first line "Y1" of the two lines, which is closer to the outer periphery of the semiconductor chip 1.

The second non-inverting pad electrode "P2" is arranged between the boundary "Z1" between the first IO cell region "IO1" and the second IO cell region "IO2" and the boundary "Z2" between the second IO cell region "IO2" and the third IO cell region "IO3".

The second inverting pad electrode "N2" is arranged between the boundary "Z2" between the second IO cell region "IO2" and the third IO cell region "IO3" and a boundary "Z3" between the third IO cell region "IO3" and another IO cell region.

As shown in FIGS. 8 and 9, the second non-inverting pad electrode "P2" includes an extension part "P2b", which extends from a rectangular main body part thereof. The second inverting pad electrode "N2" includes an extension part "N2b", which extends from a rectangular main body part thereof.

That is, the second embodiment differs from the first embodiment in configuration and position of the second non-inverting pad electrode "P2" and the second inverting pad electrode "N2".

As shown in FIG. 9, the second differential amplifying circuit "A2" is provided in the second IO cell region "IO2", which is adjacent to the first IO cell region "IO1".

The extension part "N2b" of the second inverting pad electrode "N2" is electrically connected to the inverting output terminal (inverting terminal) of the second differential amplifying circuit "A2" provided in the second IO cell region "IO2".

The extension part "P2b" of the second non-inverting pad electrode "P2" is electrically connected to the non-inverting output terminal (non-inverting terminal) of the second differential amplifying circuit "A2" provided in the second IO cell region "IO2".

As in the first embodiment, differential signals output from the differential amplifying circuits are supplied to the inverting pad electrodes and the non-inverting pad electrodes. In addition, as described above, the lengths of the wires from the non-inverting pad electrode and inverting pad electrode connected to one differential amplifying circuit of the semiconductor chip 1 to the bonding fingers are equal. Therefore, characteristics of the differential signals of the differential amplifying circuits can be improved.

As described above, the example shown in FIG. 9 concerns a circuit configuration in which the differential amplifying circuits provide differential outputs. However, a circuit configuration in which the differential amplifying circuits receive differential inputs is also possible. In that case, the inverting input terminals (inverting terminals) of the differential amplifying circuits are connected to the inverting pad electrodes, and the non-inverting input terminals (non-inverting terminals) of the differential amplifying circuits are connected to the non-inverting pad electrodes.

Figure 10:
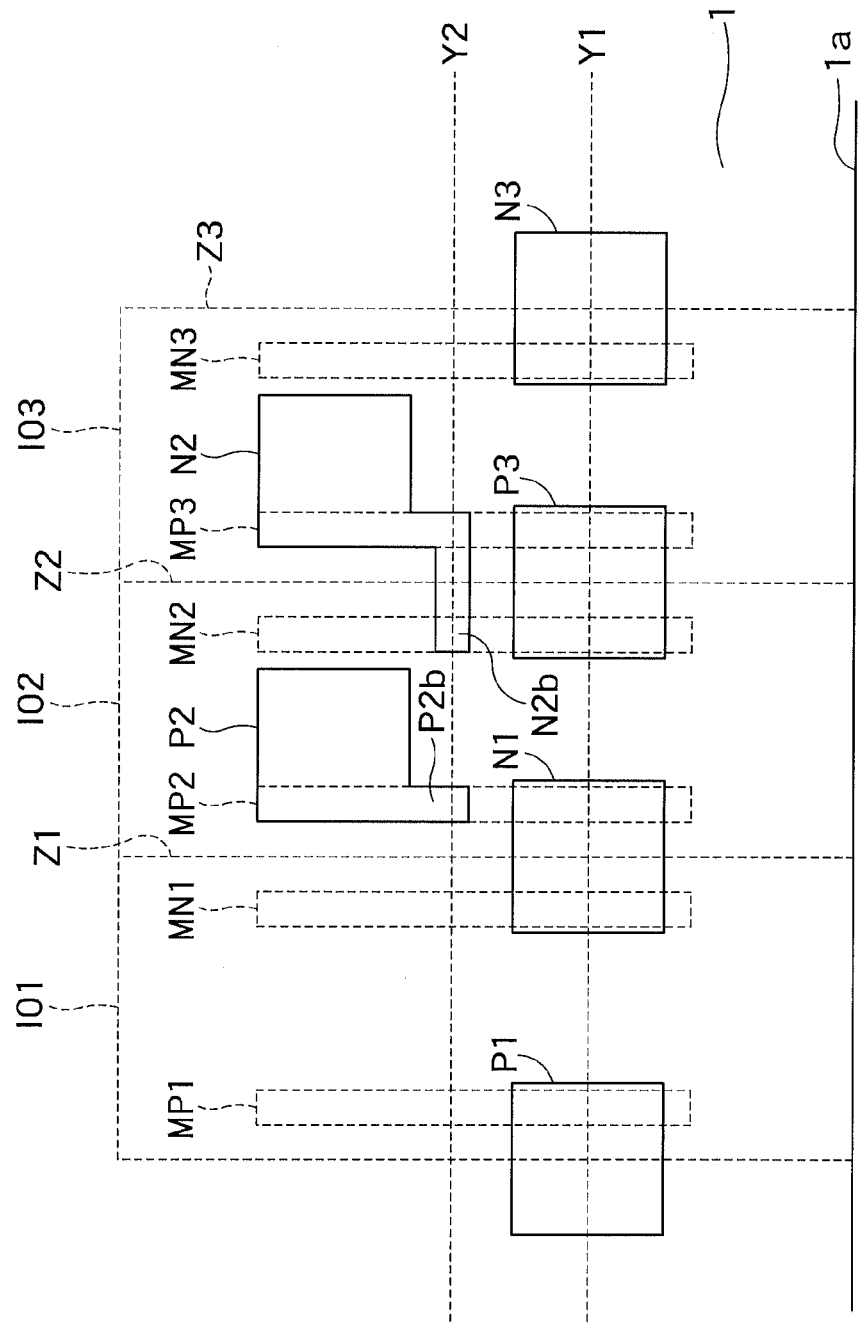
FIG. 10 is a top view showing an example of a configuration of metal layers and the pad electrodes in the IO cell regions shown in FIG. 8.
Figure 11:
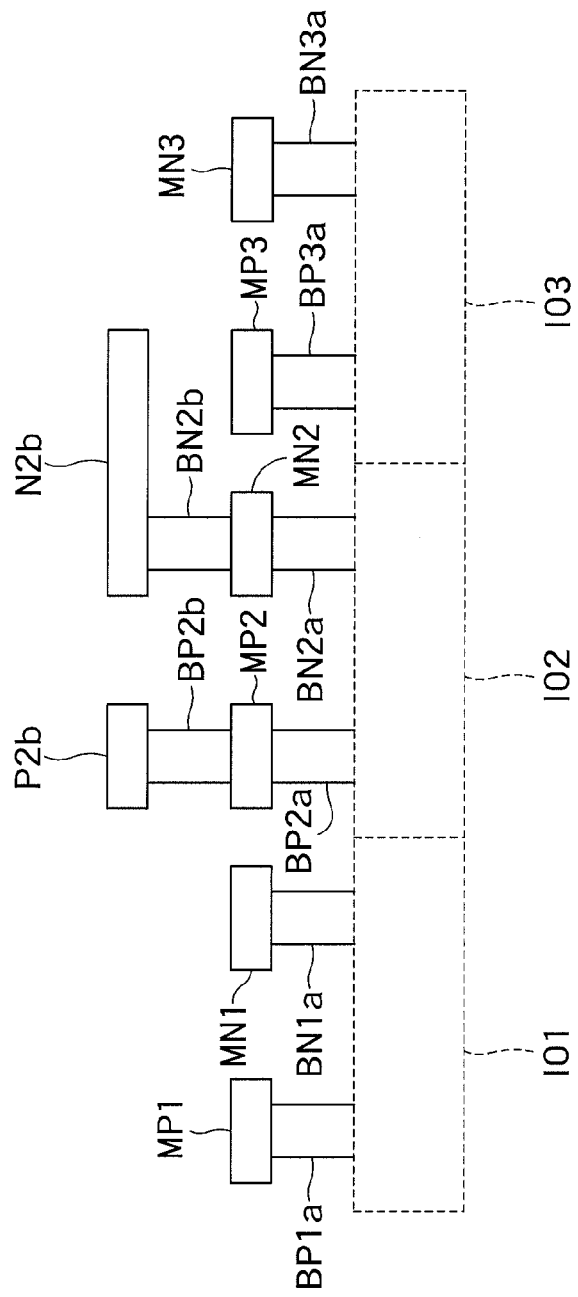
FIG. 11 is a cross-sectional view of the arrangement shown in FIG. 10 taken along the second line "Y2".

FIG. 10 is a top view showing an example of a configuration of metal layers and the pad electrodes in the IO cell regions shown in FIG. 8. FIG. 11 is a cross-sectional view of the arrangement shown in FIG. 10 taken along the second line "Y2". The cross section of the arrangement taken along the first line "Y1" in FIG. 10 is the same as the cross section shown in FIG. 6 described above. For the sake of simplicity, FIG. 10 does not show vias. In FIG. 11, illustration of an insulating layer is omitted.

As shown in FIGS. 6, 10 and 11, the semiconductor chip 1 includes first metal layer parts "MP1", "MP2" and "MP3", second metal layer parts "MN1", "MN2" and "MN3", and vias "BP1a", "BP1b", "BP2a", "BP2b", "BP3a", "BP3b", "BN1a", "BN1b", "BN2a", "BN2b", "BN3a" and "BN3b".

As shown in FIGS. 6, 10 and 11, the first to third non-inverting pad electrodes "P1", "P2" and "P3" are disposed above the first to third IO cell regions "IO1", "IO2" and "IO3", respectively. The first to third inverting pad electrodes "N1", "N2" and "N3" are disposed above the first to third IO cell regions "IO1", "IO2" and "IO3", respectively.

As shown in FIGS. 10 and 11, the first metal layer part "MP2" is disposed between the second IO cell region "IO2" and the second non-inverting pad electrode "P2" (the extension part "P2b"). The first metal layer part "MP2" extends above the second IO cell region "IO2" in the direction perpendicular to the side "1a" of the semiconductor chip 1 (FIG. 10).

The first metal layer part "MP2" electrically connects the non-inverting output terminal of the second differential amplifying circuit "A2" and the extension part "P2b" of the second non-inverting pad electrode "P2" to each other through the vias "BP2a" and "BP2b".

The second metal layer part "MN2" is disposed between the second IO cell region "IO2" and the second inverting pad electrode "N2" (the extension "N2b"). The second metal layer part "MN2" extends above the second IO cell region "IO2" in the direction perpendicular to the side "1a" of the semiconductor chip 1 (FIG. 10).

The second metal layer part "MN2" electrically connects the inverting output terminal of the second differential amplifying circuit "A2" and the extension part "N2b" of the second inverting pad electrode "N2" to each other through the vias "BN2a" and "BN2b".

The remainder of the configuration is the same as that according to the first embodiment. That is, since the lengths of the wires from the non-inverting pad electrode and inverting pad electrode connected to one differential amplifying circuit of the semiconductor chip 1 to the bonding fingers are equal, characteristics of the differential signals of the differential amplifying circuits can be improved.

As described above, the semiconductor chip according to this embodiment can improve characteristics of the differential signals, as with the semiconductor chip according to the first embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor package, comprising:
a base substrate; and
a semiconductor chip mounted on the base substrate,
wherein the semiconductor chip comprises:
a plurality of IO cell regions disposed in a line along a side of the semiconductor chip, a differential circuit being provided in each of the plurality of IO cell regions;
a non-inverting pad electrode disposed above each of the IO cell regions and electrically connected to a non-inverting terminal of the differential circuit;
an inverting pad electrode disposed above each of the IO cell regions and connected to an inverting terminal of the differential circuit,
wherein a first set of a first non-inverting pad electrode and a first inverting pad electrode is disposed above a first IO cell region of the plurality of IO cell regions, and the first set is disposed so that the first non-inverting pad electrode and the first inverting pad electrode are disposed along a first line along the side of the semiconductor chip,
wherein a second set of a second non-inverting pad electrode and a second inverting pad electrode is disposed above a second IO cell region of the plurality of IO cell regions, and the second set is disposed so that the second non-inverting pad electrode and the second inverting pad electrode are disposed along a second line along the side of the semiconductor chip, and wherein the semiconductor chip comprises:
a first wire that electrically connects the first non-inverting pad electrode of the first set and a first finger provided on the base substrate to each other, the first set being disposed on the first line of the first and second lines, and the first line being closer to an outer periphery of the semiconductor chip;
a second wire that electrically connects the first inverting pad electrode of the first set and a second finger provided on the base substrate to each other;
a third wire that electrically connects the second non-inverting pad electrode of the second set and a third finger provided on the base substrate to each other, the second set being disposed on the second line of the first and second lines, and the second line being closer to a center of the semiconductor chip;
a fourth wire that electrically connects the second inverting pad electrode of the second set and a fourth finger provided on the base substrate to each other,
wherein a length of the first wire is equal to a length of the second wire,
wherein a length of the third wire is equal to a length of the fourth wire, and
wherein the first finger and the second finger are disposed on the base substrate in a third line along the side of the semiconductor chip, and the third finger and the fourth finger are disposed on the base substrate in a fourth line along the side of the semiconductor chip, the fourth line being different from the third line.

2. The semiconductor package according to claim 1, wherein the plurality of IO cell regions have a same circuit configuration except for a wiring layer.

3. The semiconductor package according to claim 1, wherein the first inverting pad electrode is connected to an inverting terminal of a first differential circuit provided in the first IO cell region of the plurality of IO cell regions,
the second non-inverting pad electrode is connected to a non-inverting terminal of a second differential circuit provided in the second IO cell region of the plurality of IO cell region, the second IO cell region being adjacent to the first IO cell region, and
the first inverting pad electrode and the second non-inverting pad electrode are disposed side by side in a direction perpendicular to the side of the semiconductor chip.

4. The semiconductor package according to claim 3, wherein the first inverting pad electrode and the second non-inverting pad electrode are disposed on a boundary between the first IO cell region and the second IO cell region.

5. The semiconductor package according to claim 3, further comprising:
a first metal layer that is disposed between the first IO cell region and the first non-inverting pad electrode and electrically connects a non-inverting terminal of the first differential circuit and the first non-inverting pad electrode to each other; and
a second metal layer that is disposed between the second IO cell region and the second inverting pad electrode and electrically connects an inverting terminal of the second differential circuit and the second inverting pad electrode to each other.

6. The semiconductor package according to claim 5, wherein the first metal layer extends above the first IO cell region in the direction perpendicular to the side of the semiconductor chip, and
the second metal layer extends above the second IO cell region in the direction perpendicular to the side of the semiconductor chip.

7. The semiconductor package according to claim 5, wherein the semiconductor chip further comprises a core region disposed in a center part of the semiconductor chip, an internal circuit being provided in the core region.

8. A semiconductor chip comprising:
- a core region disposed in a center part of the semiconductor chip, an internal circuit being provided in the core region;
- a plurality of IO cell regions disposed in a line along a side of a semiconductor chip, a differential circuit being provided in each of the plurality of IO cell regions;
- a non-inverting pad electrode disposed above each of the IO cell regions and electrically connected to a non-inverting terminal of the differential circuit; and
- an inverting pad electrode disposed above each of the IO cell regions and connected to an inverting terminal of the differential circuit,
- wherein a first set of a first non-inverting pad electrode and a first inverting pad electrode is disposed above a first IO cell region of the plurality of IO cell regions, and the first set is disposed so that the first non-inverting pad electrode and the first inverting pad electrode are disposed along a first line along the side of the semiconductor chip, and
- wherein a second set of a second non-inverting pad electrode and a second inverting pad electrode is disposed above a second IO cell region of the plurality of IO cell regions, and the second set is disposed so that the second non-inverting pad electrode and the second inverting pad electrode are disposed along a second line along the side of the semiconductor chip,
- the semiconductor chip comprising:
- a first wire that electrically connects the first non-inverting pad electrode of the first set and a first finger provided on the base substrate to each other, the first set being disposed on the first line of the first and second lines, and the first line being closer to an outer periphery of the semiconductor chip;
- a second wire that electrically connects the first inverting pad electrode of the first set and a second finger provided on the base substrate to each other;
- a third wire that electrically connects the second non-inverting pad electrode of the second set and a third finger provided on the base substrate to each other, the second set being disposed on the second line of the first and second lines, and the second line being closer to a center of the semiconductor chip; and
- a fourth wire that electrically connects the second inverting pad electrode of the second set and a fourth finger provided on the base substrate to each other,
- wherein a length of the first wire is equal to a length of the second wire,
- wherein a length of the third wire is equal to a length of the fourth wire, and
- wherein the first finger and the second finger are disposed on the base substrate in a third line along the side of the semiconductor chip, and the third finger and the fourth finger are disposed on the base substrate in a fourth line along the side of the semiconductor chip, the fourth line being different from the third line.

9. The semiconductor chip according to claim 8, wherein the plurality of IO cell regions have a same circuit configuration except for a wiring layer.

10. The semiconductor chip according to claim 8, wherein the first inverting pad electrode is connected to an inverting terminal of a first differential circuit provided in the first IO cell region of the plurality of IO cell regions,
- the second non-inverting pad electrode is connected to a non-inverting terminal of a second differential circuit provided in the second IO cell region of the plurality of IO cell region, the second IO cell region being adjacent to the first IO cell region, and
- the first inverting pad electrode and the second non-inverting pad electrode are disposed side by side in a direction perpendicular to the side of the semiconductor chip.

11. The semiconductor chip according to claim 10, wherein the first inverting pad electrode and the second non-inverting pad electrode are disposed on a boundary between the first IO cell region and the second IO cell region.

12. The semiconductor chip according to claim 10, further comprising:
- a first metal layer that is disposed between the first IO cell region and the first non-inverting pad electrode and electrically connects a non-inverting terminal of the first differential circuit and the first non-inverting pad electrode to each other; and
- a second metal layer that is disposed between the second IO cell region and the second inverting pad electrode and electrically connects an inverting terminal of the second differential circuit and the second inverting pad electrode to each other.

13. The semiconductor chip according to claim 12, wherein the first metal layer extends above the first TO cell region in the direction perpendicular to the side of the semiconductor chip, and
- the second metal layer extends above the second IO cell region in the direction perpendicular to the side of the semiconductor chip.

14. The semiconductor chip according to claim 12, wherein the semiconductor chip further comprises a core region disposed in a center part of the semiconductor chip, an internal circuit being provided in the core region.

* * * * *